Oct. 20, 1970 G. H. LOOSE 3,535,099
METHOD OF FORMING A HERMETIC ENCLOSURE FOR ELECTRONIC DEVICES
Original Filed April 29, 1965 2 Sheets-Sheet 1

INVENTOR.
Guenter H. Loose
BY
Walter S. Zaleski
ATTORNEY

METHOD OF FORMING A HERMETIC ENCLOSURE FOR ELECTRONIC DEVICES

Original Filed April 29, 1965

INVENTOR.
Guenter H. Loose
BY Walter S. Zabrowski
ATTORNEY 3,535,099
Patented Oct. 20, 1970

3,535,099

METHOD OF FORMING A HERMETIC ENCLOSURE FOR ELECTRONIC DEVICES

Guenter H. Loose, Webster, N.Y., assignor to Corning Glass Works, Corning, N.Y., a corporation of New York Original application Apr. 29, 1965, Ser. No. 451,941, now Patent No. 3,379,823. Divided and this application Dec. 15, 1967, Ser. No. 690,829
Int. Cl. C03c *29/00*
U.S. Cl. 65—59 3 Claims

ABSTRACT OF THE DISCLOSURE

An economic method of forming a hermetic, mechanically strong enclosure for miniature electronic devices. A metal header plate having collets is placed on a suitable jig and within a cavity and apertures in the header plate a header body formed of nonconductive thermoplastic material such as glasses, glass-ceramics, and the like with a lower coefficient of expansion than said plate and having bushing-like protrusions is disposed. Leads are inserted through the header body and a weight is placed over the components. The jig is covered and the assembly is placed in a furnace at a temperature and for a time sufficient to fusion seal the components together. A cover plate is thereafter attached to the header plate.

This application is a division of application Ser. No. 451,941, filed Apr. 29, 1965 and now U.S. Pat 3,379,823.

BACKGROUND OF THE INVENTION

Electronic devices such as transistors, diodes, semiconductors, miniature silicon integrated circuits, and the like are commonly sealed in an enclosure having a body of electrically insulating material. Such a body may be formed with a relatively large planar bottom surface surrounded by a rim defining a cavity within which an electronic device is disposed. Electrically conductive leads extending from within said cavity to the outside of said body are provided.

Heretofore, enclosures were formed of fused or sintered glass particles within which preformed leads were embedded. Enclosures were also formed by sandwiching preformed leads between a pair of glass plates, fusing the plates together, and thereafter etching a cavity in one of said plates until the leads were exposed therein. Other enclosures were formed in a different manner, but essentially all endeavored to provide protection for delicate electronic devices contained therein.

Unfortunately, prior art enclosures of the types briefly described has low thermal conductivity, poor mechanical and thermal shock resistance, require difficult and costly lead configurations, had unpredictable hermeticity, weak lead structure and many other disadvantages.

Hermetic enclosures are well known as means for encapsulating and protecting delicate electronic devices and components from damaging agents and environments such as contamination, moisture, corrosive gases, thermal and mechanical shock, and the like. Means for conducting electrical current to and from encapsulated electronic components must be strong, reasonably flexible, and highly conductive. When a plurality of such means are used they must be insulated from each other and must also be insulated from the enclosure, if the enclosure is made from a conductive material. An important requirement for such means is that they be capable of preserving enclosure hermeticity. Examples of such means are known in the art as leads, conductive leads, leadthroughs, lead wires, pins and the like. Commonly, they are formed of wire or foil, and lead directly through the walls of an enclosure.

When an enclosure is made from a dielectric material such as glass or ceramic for example, leads may be sealed through the walls thereof in a simple, straightforward manner. However, when an enclosure is made from an electrically conductive material such as metal, conductive leads must be carefully insulated from the enclosure. Such a requirement complicates the lead-through structure and introduces many problems. There are only a few, satisfactory means for sealing conductive leads through walls of metal enclosures. Some commonly used means introduce problems such as inadequate mechanical strength, poor shock resistance, loss of hermeticity by seal leakage, limited choice of compatible sealing material, variability of seal strength and variable hermeticity caused by process variability, uncontrolled and excessive stresses in the dielectric material, and the like. The structure of a hermetic enclosure is often unsuitable for the available means of introducing conductive leads therethrough.

Glass-to-metal seals and ceramic-to-metal seals are among the most commonly employed prior art means for leading conductors into metal hermetic enclosures. Such seals often utilize conductive leads, such as wire, surrounded by, or "beaded" with, a dielectric material. The "beads" of such material are then sealed through apertures in a wall of the metal enclosure. "Beading" is a process for applying a coating, a film, or a "bead" of dielectric material to a conductor, and is accomplished at a temperature sufficient to fuse the dielectric material to the conductor. Such coated conductors are called "beaded" leads. Other methods are known for sealing wires through metal enclosures, but all of them have limitations.

Basic requirements for making glass-to-metal seals according to prior art teaching are well known. Shand, in the Second Edition (1958) of his Glass Engineering Handbook, published by McGraw-Hill Book Company, Inc., teaches the technology and requirements for making glass-to-metal seals. In particular, chapter five deals intensively with the subject and will be a reference source for certain of the terms, means and methods hereinafter described.

SUMMARY OF THE INVENTION

An object of the present invention is to provide a hermetic enclosure which overcomes the heretofore noted disadvantages of prior art enclosures.

Another object of the present invention is to provide a hermetic enclosure suitable for enclosing and encapsulating miniature electronic devices, and a method whereby such an enclosure may be simply and economically manufactured.

Still another object of the present invention is to provide a hermetic enclosure incorporating a plurality of electrically insulated conductive leads.

A further object of the present invention is to provide a hermetic enclosure which is mechanically strong and resistant to thermal shock.

A still further object of the present invention is to provide a hermetic enclosure having high heat conductivity.

The present invention is an improved hermetic enclosure suitable for encapsulating and protecting miniature electronic components. The enclosure comprises a thin, apertured, sheet metal header plate having flanged sidewalls which define at least one shallow cavity therein. The header plate apertures are defined by collets extruded from the sheet metal and located at the bottom of said cavity. The enclosure further comprises an apertured header body formed of a nonconductive, thermoplastic material. Said body has a plurality of bushing-like protrusions extending from one surface thereof, and axially aligned with said apertures. The header body is disposed within the header plate cavity, and said protrusions are disposed within the header plate apertures. The enclosure further comprises a plurality of conductive leads disposed within said header body apertures. Said leads are insulated from each other and from said header plate by means of said bushing-like protrusions. Said leads extend through the bushing-like protrusions, through the header plate apertures, and terminate outside said header plate. The header body is fusion sealed to the header plate, and the protrusions thereof are likewise sealed to said collets. The conductive leads are also securely and hermetically sealed within said header body. The hermetic enclosure further comprises a thin, sheet metal cover plate having flanged sidewalls which define a shallow cavity therein. Said cover plate is disposed on said header plate in such a manner that their flanges are disposed in mutually continuous, contacting relationship, and sealed to form a gas-tight, or hermetic joint.

Additional objects, features and advantages of the present invention, will become apparent from the following detailed description and drawing.

DETAILED DESCRIPTION

Figure 1:
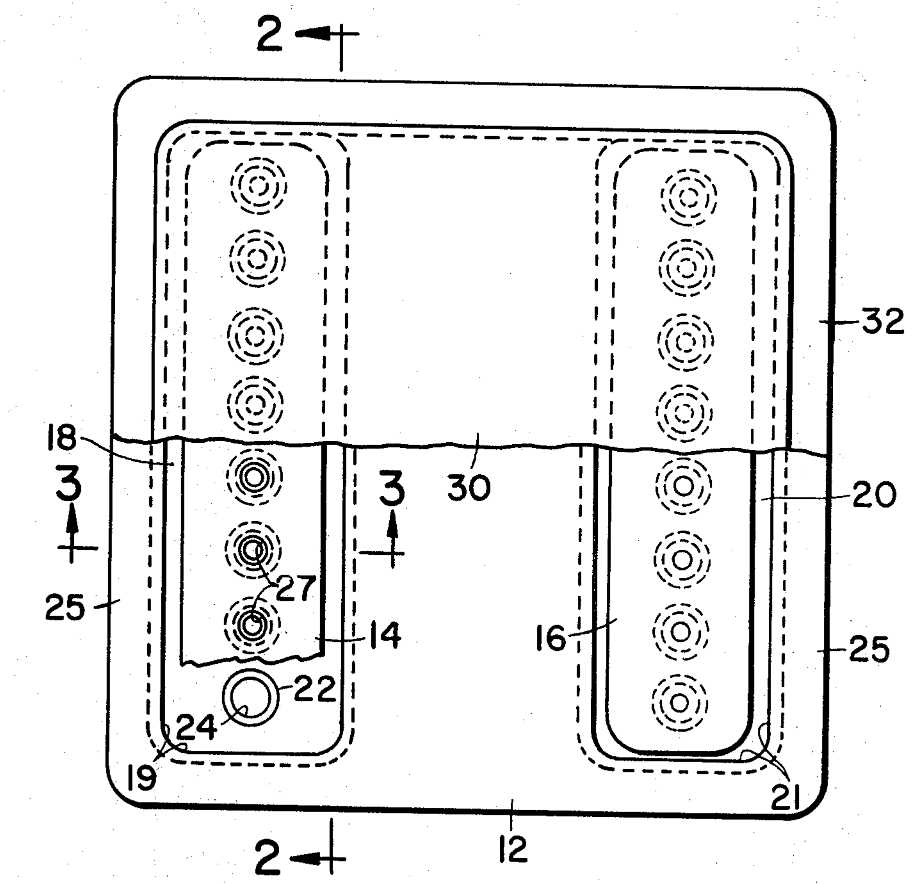
FIG. 1 is a plan view of the hermetic enclosure according to the present invention, shown as having a portion cut away to better illustrate certain components thereof.

Referring to FIG. 1, apertured header plate 12 accommodates apertured header bodies 14 and 16 within cavities 18 and 20, which are defined by flanged sidewalls 19 and 21 of said header plate.

It has been discovered that a particularly strong, shock-resistant, and hermetic enclosure may be produced if a configuration such as is illustrated in FIG. 1, is utilized. It has further been discovered that particular advantages may be realized from such a configuration if the header plate has a different, and higher, thermal expansion coefficient than the expansion coefficient of the header bodies. Accordingly, as an illustrative example only, the header plate may be made from a material having an expansion coefficient of between about 120 and $130\times10^{-7}$ cm./cm./ ° C. The header bodies may be made from a material having an expansion coefficient of about $90\times10^{-7}$ cm./cm./ ° C. Such a difference in expansion coefficient provides a compression seal, as follows: the header plate, having a greater expansion and contraction than the header bodies and upon cooling after sealing, undergoes greater total shrinkage than said header bodies. Thus, collets 22, surrounding apertures 24 in which certain extended portions of the header bodies are disposed, contract radially about said extended portions, placing them in radial compression.

Figure 2:
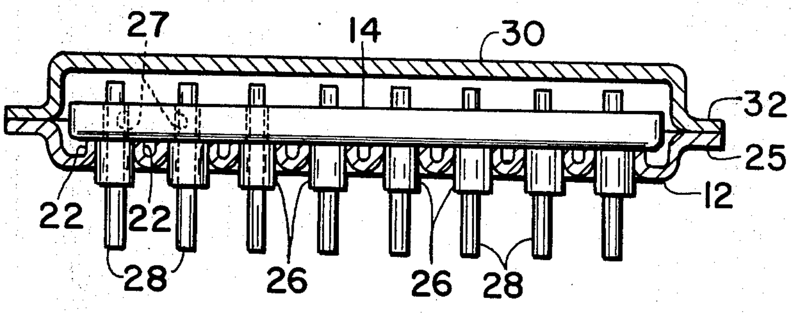
FIG. 2 is a cross sectional view of the enclosure of FIG. 1, taken along line 2—2 thereof.

In FIG. 2, such portions are shown as bushing-like protrusions 26, extensions from one surface of header body 14. Both header bodies have such protrusions disposed within the header plate apertures. Flanges 25 shown in FIGS. 1 and 2 provide stiffness to the header plate and provide an attachment surface for cover plate 30 and mating flanges 32 thereof.

The header plate material must have an expansion coefficient higher than the expansion coefficient of the header body material; it must be readily sealable to the header body material in a fusion sealing process; it should be readily solderable or weldable to itself; it should be easily plated by metal such as gold or silver; and it should be a good conductor of both thermal and electrical energy. By readily sealable, it is meant that the metal can be uniformly oxidized so as to be "wetted" by the dielectric material during a fusion sealing process, in order to form a strong, hermetic seal thereto. A suitable material which may be used for the header plate of the present invention is thin, copper-clad, mild steel sheet. Other materials such as nickel-iron alloys may be used, but do not have all of the desired features and advantages of the preferred material.

The header body material must have an expansion coefficient lower than the expansion coefficient of the header plate material; it must be readily sealable to both the header plate material and the conductive lead material, with which it should share a substantially compatible expansion coefficient; it should not require fusion sealing temperature sufficient to damage the material of either the conductive leads or the header plates; and it must have a high resistivity to provide adequate electrical insulation between said conductive leads and said header plate. An example of a suitable header body material, for use with the above-described illustrative example of header plate material, is glass of the potash-soda-lead type, having an expansion of about $89.5\times10^{-7}$ cm./cm./° C. Such a material may also be preformed in a plurality of intricate shapes by means taught in U.S. Pats. 2,314,-824 and 2,390,354. Also suitable as header body materials are some other glasses, glass ceramics, thermally devitrifiable solder glasses and the like.

For best results it is suggested that the material of the header plate have a thermal expansion coefficient of between about $20\times10^{-7}$ and $40\times10^{-7}$ cm./cm./° C. higher than the thermal expansion coefficient of the header body material.

Disposed within apertures 27 of header body 14, as shown in FIG. 2, are conductive leads 28. These leads must have high electrical conductivity such as is provided by copper; they must readily seal to the header body material and have a thermal expansion coefficient substantially compatible therewith; they should be flexible, yet provide seal strength and hermeticity; and they should be easily solderable or weldable to electrical circuit components, and to the electronic components within the enclosure. By substantially compatible it is meant that the two materials should have expansion coefficients which are within about $5\times10^{-7}$ cm./cm./° C. of each other at the setting point of the glass.

While nominal expansion coefficients, taken between 0° and 300° C. are ordinarily used in talking of thermal expansion and contraction, it will be obvious to one familiar with the art that good sealing practice dictates that the thermal expansion coefficients of the materials being sealed be determined at the setting point of the glass; in a glass-to-metal seal, and at the setting point of the softer glass in a glass-to-glass seal. A material which meets these criteria is a copper-clad, nickel-iron alloy, formed into wire having a radial expansion coefficient of about $90\times10^{-7}$ cm./cm./° C. and an axial expansion coefficient of about $63\times10^{-7}$ cm./cm./° C. Such wire is known as Dumet, and is commonly used for conductive leads. To improve the sealability of Dumet wire to glass, its copper cladding is borated to provide a uniform oxide on the surface thereof. The borated copper surface resists further, undesirable and uncontrolled oxidation. Similar materials which meet the required criteria may be used for the conductive leads, even if they do not provide all the desired attributes. Such materials include alloys of nickel-iron, for example, which have no cladding.

Figure 3:
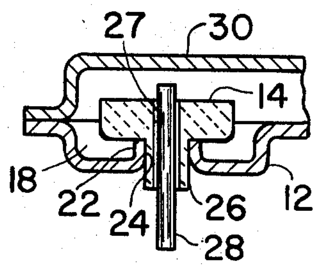
FIG. 3 is a cross sectional view of the hermetic enclosure of FIG. 1, taken along line 3—3 thereof.

In FIG. 3 header body 14 rests upon collet 22 within cavity 18 of header plate 12. Conductive lead 28 is inserted through aperture 27 of the header body, and protrudes from the header plate by an amount which remains fixed during sealing.

Figure 4:
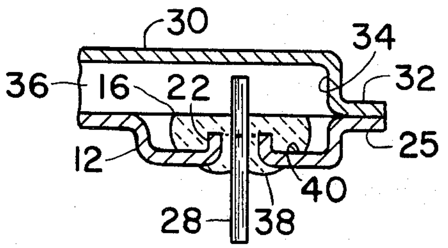
FIG. 4 is a cross sectional view of a portion of a hermetic enclosure shown after sealing and cover plate attachment.

In FIG. 4 is will be noted that header body 16 has slumped or deformed during sealing to embed collet 22, and a rivet-like portion 38 has been formed from a bushing-like protrusion 26 of FIGS. 2 and 3. The rivet-like portion "locks" together header body 16 and header plate 12, forming a mechanically strong, hermetic seal along surface 40 thereof. Conductive lead 28 is securely maintained within, and sealed to, the header body which insulates said lead from the header plate. Flange 25 of the header plate is shown securely attached to flange 32 of cover plate 30, whose sidewalls 34 define cavity 36, suitable for containing a miniature electronic device.

The header plate and cover plate flanges may be hermetically sealed together by such means as soldering, brazing, or welding. Resistance welding is particularly simple and reliable.

Figure 5:
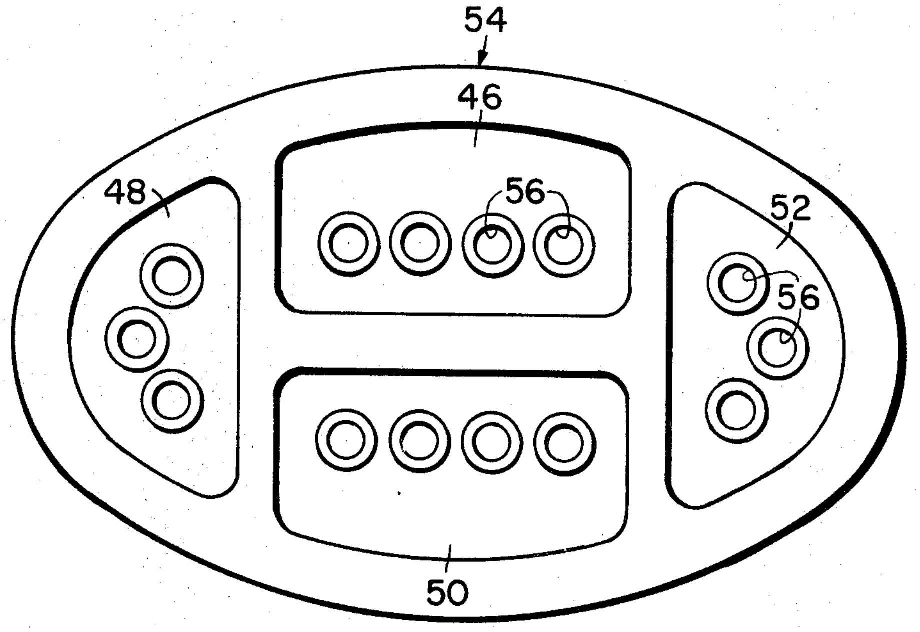
FIG. 5 is a plan view of another header plate embodiment for use with a hermetic enclosure constructed according to the present invention.

FIG. 5 illustrates another embodiment of the present invention wherein a plurality of shallow cavities 46, 48, 50 and 52 are formed in oval header plate 54. A plurality of apertures 56 are shown, and are suitable for containing header body protrusion and conductive leads.

The method by which all components of the hermetic enclosure may be assembled and sealed together requires that all components thereof, except the cover plate, be firmly assembled and held in a jig to prevent slippage and misalignment. Such an assembly is called a sealing assembly. For best results, it is desirable that the material of the sealing jig be capable of repeatedly withstanding sealing temperatures without twisting, warping, increasing in size, or exuding contaminants. A satisfactory material for the sealing jig is boron nitride, which satisfies the above requirements. An oven or furnace, capable of containing the sealing assembly may be used to raise the temperature of the thermoplastic header body material, causing it to fuse and unite with the material of the header plate and conductive leads, thereby forming a fusion seal. Pressure is applied to the header bodies to force them over the header plate collets, and to form the rivet-like portions described above. Suitable pressure may be provided by weights placed on the header bodies. The sealing jig and components contained therein may be covered during sealing. An elevated temperature is maintained for a sufficient length of time to insure that adequate seals betwen glass and metal are formed. After cooling, the sealed parts, called a header assembly, are removed from the jig. Indications of adequate and satisfactory sealing times and temperatures may be obtained from tests of the header assembly, and from the appearance of its sealed components. Such tests which include thermal shock tests, leak tests, and the like are well known to those familiar with the art.

An advantage of the furnace sealing method is that a plurality of seals may be accomplished simultaneously in a given thermal environment. Sealing uniformity is likely to be excellent within a given assembly, and also between assemblies. Another advantage of the present method for producing strong, hermetic seals is that conductive leads need not be prebeaded. The header body protrusions act in place of beads, with the further advantage of "locking" the assembled components together. Heretofore, prebeading represented a costly, unreliable and time-consuming extra process step.

In a typical, but by no means limiting, example of the present invention, the cover plate and header plate are made from copper-clad mild steel having a thickness of about .0125 inch. The header bodies are made from a potash-soda-lead glass having a composition such as shown in Table I. Said glass is preformed to the desired shape and size by the process taught in U.S. Pat. No. 2,390,354.

TABLE I

| Constituents: | Approx. percent (by weight) |
|---|---|
| $SiO_2$ | 57 |
| PbO | 30 |
| $K_2O$ | 08 |
| $Na_2O$ | 04 |
| $Al_2O_3$ | 01 |
| Total | 100 |

The conductive leads are made from Dumet and have a diameter of about .016 inch.

The component parts are assembled and held in a boron nitride jig by metal weights and carbon blocks which prevent the weights from fusing to the glass. The sealing assembly so formed is placed in a furnace at about 1500° F. for 14 minutes. After cooling the header assembly is removed from the jig, and the desired electronic components are attached to the conductive leads. The cover plate is resistance welded to the header plate completing the hermetic seal and enclosure.

Appropriate tests of enclosure hermeticity and strength are made according to procedures known to those familiar with the art. Such tests include thermal shock tests, leak tests, lead bending tests and the like.

Although the present invention has been described with respect to specific details of certain embodiments thereof it is not intended that such details be limitations upon the scope of the invention except insofar as set forth in the following claims.

I claim:

1. The method of forming a hermetic enclosure comprising the steps of placing on a suitable sealing jig an apertured sheet metal header plate having at least one shallow cavity formed therein, said cavity being defined by flanged sidewalls, the apertures being defined by collets extruded from said sheet metal and located within said cavity, said cavity and collets being adapted to receive a header body, disposing within said header plate cavity an apertured header body formed from a nonconductive, thermoplastic material selected from the group consisting of glasses and glass ceramics, said body having bushing-like protrusions extending from one surface thereof, said bushing-like protrusions being aligned with said header plate apertures and seated within said collets, said thermoplastic material having a lower coefficient of expansion than said sheet metal, inserting one end of a conductive lead through each of said header body apertures and into said jig, said jig being adapted to receive one end of said leads, placing a weight over said header body, header plate, and conductive leads thereby forming a sealing assembly, placing said sealing assembly in a suitable furnace for a time and at a temperature sufficient to fusion seal said header plate, header body, and conductive leads into a header assembly, removing said header assembly from said sealing jig, and attaching a cover plate to said header plate at the flanges thereof.

2. The method of claim 1 wherein said header body is made from glass consisting essentially of 57% $SiO_2$, 30% PbO, 8% $K_2O$, 4% $Na_2O$, and 1% $Al_2O_3$ by weight.

3. The method of claim 1 wherein an electronic device is attached by suitable means to the other end of said conductive leads within said cavity, prior to attaching said cover plate to said header plate.

References Cited

UNITED STATES PATENTS

| | | | |
|---|---|---|---|
| 2,949,376 | 8/1960 | Comer | 65—59 |
| 3,088,299 | 5/1963 | McMahon et al. | 65—59 |
| 3,331,913 | 7/1967 | Johnson | 65—59 |

S. LEON BASHORE, Primary Examiner

E. R. FREEDMAN, Assistant Examiner

U.S. Cl. X.R.

65—54, 138, 139, 154, 155